United States Patent
Yu et al.

(10) Patent No.: US 8,374,038 B2
(45) Date of Patent: Feb. 12, 2013

(54) ERASE PROCESS FOR USE IN SEMICONDUCTOR MEMORY DEVICE

(75) Inventors: Chuan-Ying Yu, Zhubei (TW); Chun-Hsiung Hung, Hsinchu (TW); Ken-Hui Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 457 days.

(21) Appl. No.: 12/773,503

(22) Filed: May 4, 2010

(65) Prior Publication Data

US 2011/0273936 A1    Nov. 10, 2011

(51) Int. Cl.
*G11C 11/34*    (2006.01)

(52) U.S. Cl. ......... 365/185.29; 365/185.18; 365/185.19; 365/185.22

(58) Field of Classification Search ............. 365/185.33, 365/185.11, 185.05, 185.29, 185.19, 185.18, 365/185.22
See application file for complete search history.

(56) References Cited

U.S. PATENT DOCUMENTS

| | | | |
|---|---|---|---|
| 5,751,637 A | 5/1998 | Chen | |
| 5,805,501 A | 9/1998 | Shiau | |
| 6,496,417 B1 | 12/2002 | Shiau | |
| 6,975,538 B2 | 12/2005 | Abedifard | |
| 7,151,694 B2 | 12/2006 | Meihong | |
| 8,130,550 B1 * | 3/2012 | Confalonieri | 365/185.11 |
| 2001/0055225 A1 * | 12/2001 | de Sandre et al. | 365/185.19 |
| 2007/0189080 A1 | 8/2007 | Liu | |

* cited by examiner

*Primary Examiner* — Richard Elms
*Assistant Examiner* — Hien Nguyen
(74) *Attorney, Agent, or Firm* — Baker & McKenzie LLP

(57) ABSTRACT

A method of erasing memory cells of a memory device includes programming memory cells if the erasing procedure is suspended. The erasing procedure can include pre-programming, erasing, and soft-programming of memory cells in a selected memory unit. If a suspend command is received, for example to allow for a read operation of memory cells of another unit of memory, the erasing procedure stops the pre-programming, erasing, or soft-programming, and proceeds with programming one or more memory cells of the memory unit that was being erased.

13 Claims, 4 Drawing Sheets

ERASE PROCESS FOR USE IN SEMICONDUCTOR MEMORY DEVICE

BACKGROUND

1. Technical Field

The present invention relates to electronic memory devices, and more particularly, to semiconductor memory devices suitable for use as a memory devices.

2. Related Art

Semiconductor memory devices are well known and commonly found in a variety of electronic devices. Most semiconductor memory devices can be classified as either volatile or nonvolatile. A volatile memory device requires power in order to maintain the stored data, while a nonvolatile memory device can retain stored data even in the absence of power.

A well known type of nonvolatile memory is flash memory. A typical flash memory includes a memory cell array in which memory cells are arranged in rows and columns. Each memory cell includes a floating gate field-effect transistor. The logic state of a memory cell depends on the threshold voltage of the transistor, which in turn depends on the number of electrons in the floating gate of the transistor. Electrons in the floating gate partially cancel the electric field from the control gate, thereby modifying the threshold voltage of the transistor. Thus, the logic state of a flash memory state can be controlled by controlling the number of electrons in the floating gate of the transistor.

A flash memory cell can be programmed and erased in order to write respective logic states to the memory cell. The program and erase operations correspond to write operations for respective logic states, which correspond to respective threshold voltages. For convenience, the threshold voltages will simply be referred to as high and low threshold voltages, with it being understood that the high threshold voltage is relatively higher than the low threshold voltage by some detectable voltage margin. The number of electrons stored in the floating gate of a memory cell transistor can be altered by applying a strong electric field between the control gate and at least one of the source, drain, and substrate of the field-effect transistor in order to remove or accumulate electrons in the floating gate. An "erase" operation can be an operation where electrons are removed from the floating gate, thereby reducing the threshold voltage of the memory cell transistor to the low threshold voltage. A "program" operation can be an operation where electrons are accumulated in the floating gate, thereby increasing the threshold voltage of the memory cell transistor to the high threshold voltage. Since erased and programmed memory cells can be readily distinguished due to the difference in threshold voltages, the erased and programmed memory cells can be used to represent different logic states. For example, an erased memory cell can be representative of a logic state "1," while a programmed memory cell can be representative of a logic state "0."

FIG. 1 shows a flowchart of a conventional erase operation used in a flash memory. In flash memories, blocks of memory cells referred are typically erased together as a group. A block represents a number of memory cells that can be erased simultaneously during an erase operation. A conventional erase operation for erasing a block of memory cells generally includes a pre-program cycle 110, an erase cycle 120, and a soft program cycle 130.

During the pre-program cycle 110, the floating gates of all of the memory cells in a selected block are programmed to have approximately the same amount of electrons so that all of the memory cells in the selected block have approximately the same threshold voltage. The pre-program cycle 110 includes a pre-program process 112 and a pre-program verify process 114. During the pre-program process 112, a pre-program pulse is applied to all of the memory cells in the block. During the pre-program verify process 114, all of the memory cells in the block are checked to verify that their respective threshold voltages are approximately the same after application of the pre-program pulse. If an insufficient number of memory cells have the desired threshold voltage, then the pre-program process 112 is repeated. Otherwise, the operation continues to the erase cycle 120.

During the erase cycle 120, all of the memory cells in the block are erased by applying an erase pulse to the control gates of all the memory cells in the block in order to remove electrons from the floating gates of all the memory cells in the block. The erase cycle 120 includes an erase process 122 and an erase verify process 124. During the erase process 122, an erase pulse is applied to all of the memory cells in the block. During the erase verify process 124, all of the memory cells in the block are checked to verify whether they have been erased. If the number of erased memory cells is sufficient, then the block is regarded as being erased successfully. If the block fails to pass the erase verify process 124, all of the memory cells in the block are erased again by applying another erase pulse. In some systems, a voltage-stepping procedure is employed wherein the voltage is increased for each iteration of the erase cycle 120. In other systems, a time-stepping procedure is employed wherein the pulse width of the erase pulse is increased for each iteration of the erase cycle 120.

Since it is common for threshold voltages of memory cells to vary within any given block, the erase-pulse voltage required for erasing different memory cells can vary. During later iterations of the erase cycle 120, the application of an erase pulse with a relatively larger voltage or longer pulse width can result in over-erasure of some memory cells. An over-erased memory cell can cause other memory cells coupled to the same column as the over-erased memory cell to be regarded as erased cells, even though they may be programmed. Therefore, over-erased cells are typically repaired using the soft program cycle 130.

During the soft program cycle 130, over-erased memory cells in the block are detected and repaired. The soft program cycle 130 includes a soft program process 132 and a soft program verify process 134. During the soft program process 132, all of the memory cells in the block are checked to determine whether any of the memory cells are over-erased. If an over-erased memory cell is detected, it is repaired by applying a soft-program pulse. The soft-program pulse is different from a normal programming pulse in that the wordline and bitline voltages for the soft-program pulse are lower than the wordline and bitline voltages for the normal programming pulse. Also, unlike a programming pulse that is performed for programming a memory cell, a soft-program pulse is performed for erasing an over-erased memory cell. For example, a normal programming pulse can use a wordline voltage of 3.0-4.0V and a bitline voltage of 3.0-4.0V. A soft-program pulse uses a wordline voltage of approximately 2.5V and a bitline voltage of approximately 3.0V. During the soft program verify process 134, all of the memory cells in the block are checked to determine whether any over-erased memory cells remain after the application of the soft-program pulse. If the number of over-erased memory cells in the block is less than or equal to a predetermined number, e.g., zero, the block is regarded as passing the soft program verify process 134. If the block fails to pass soft program verify process 134, soft program process 132 is performed again. The soft program cycle 130 is performed successively until the block passes the soft program verify process 134.

In step 140, if there is another block which needs to be erased, pre-program cycle 110, erase cycle 120, and soft program cycle 130 of the conventional block erase operation are performed in sequence to erase the next block. In this manner, the conventional "soft program" operation is performed to correct over-erased memory cells in all blocks which are erased in the FLASH memory.

When performing the conventional "soft programming" operation, substantial time is required to successfully correct the over-erased memory cells using the conventional soft programming cycle. There is thus a general need in the art for a block erase method for use in a non-volatile memory to reduce the time and/or steps required to erase blocks of the non-volatile memory.

BRIEF DESCRIPTION OF THE DRAWINGS

Features, aspects, and embodiments of the inventions are described in conjunction with the attached drawings, in which.

DETAILED DESCRIPTION

Figure 1:
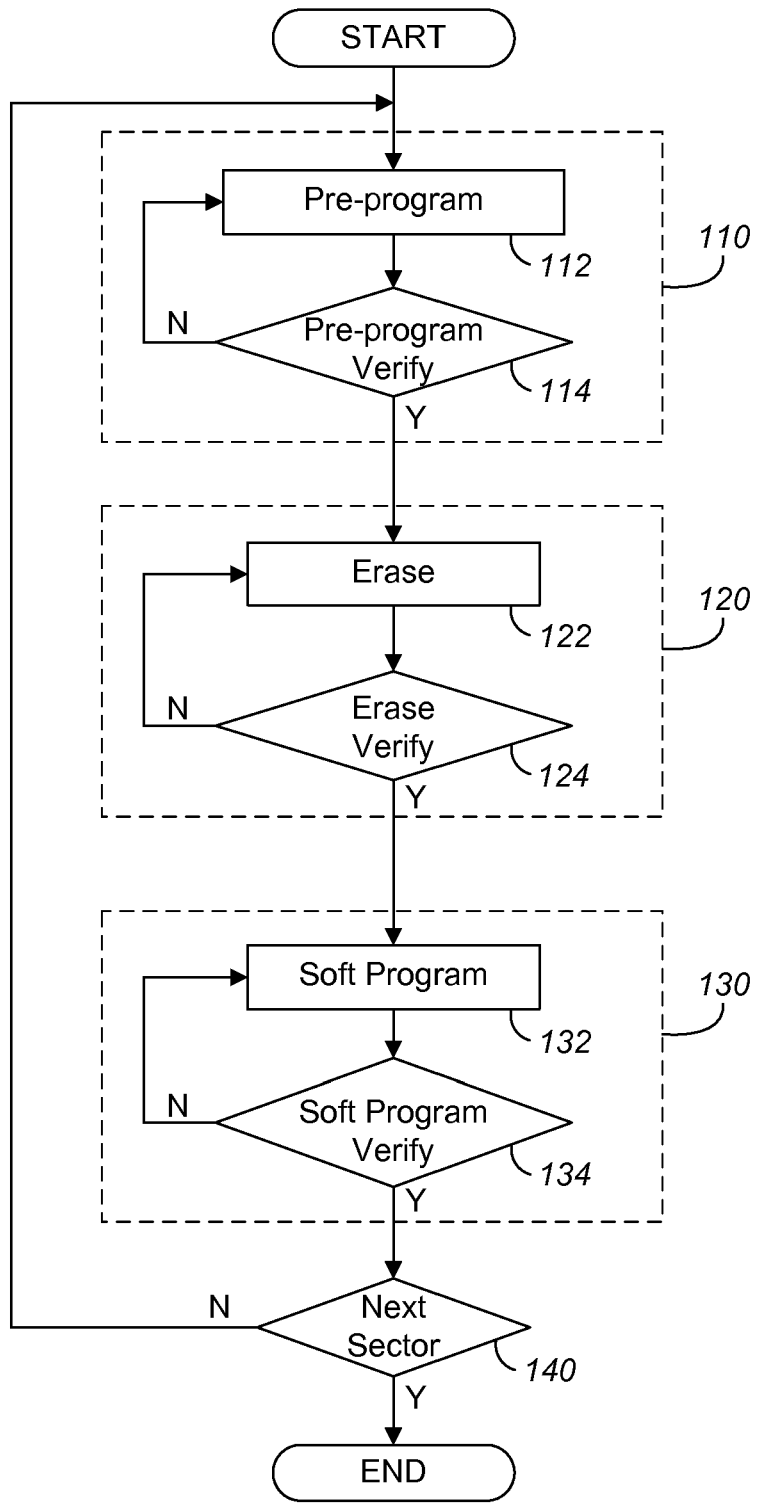
FIG. 1 shows a flowchart of a conventional erase operation used in a flash memory.
Figure 2:
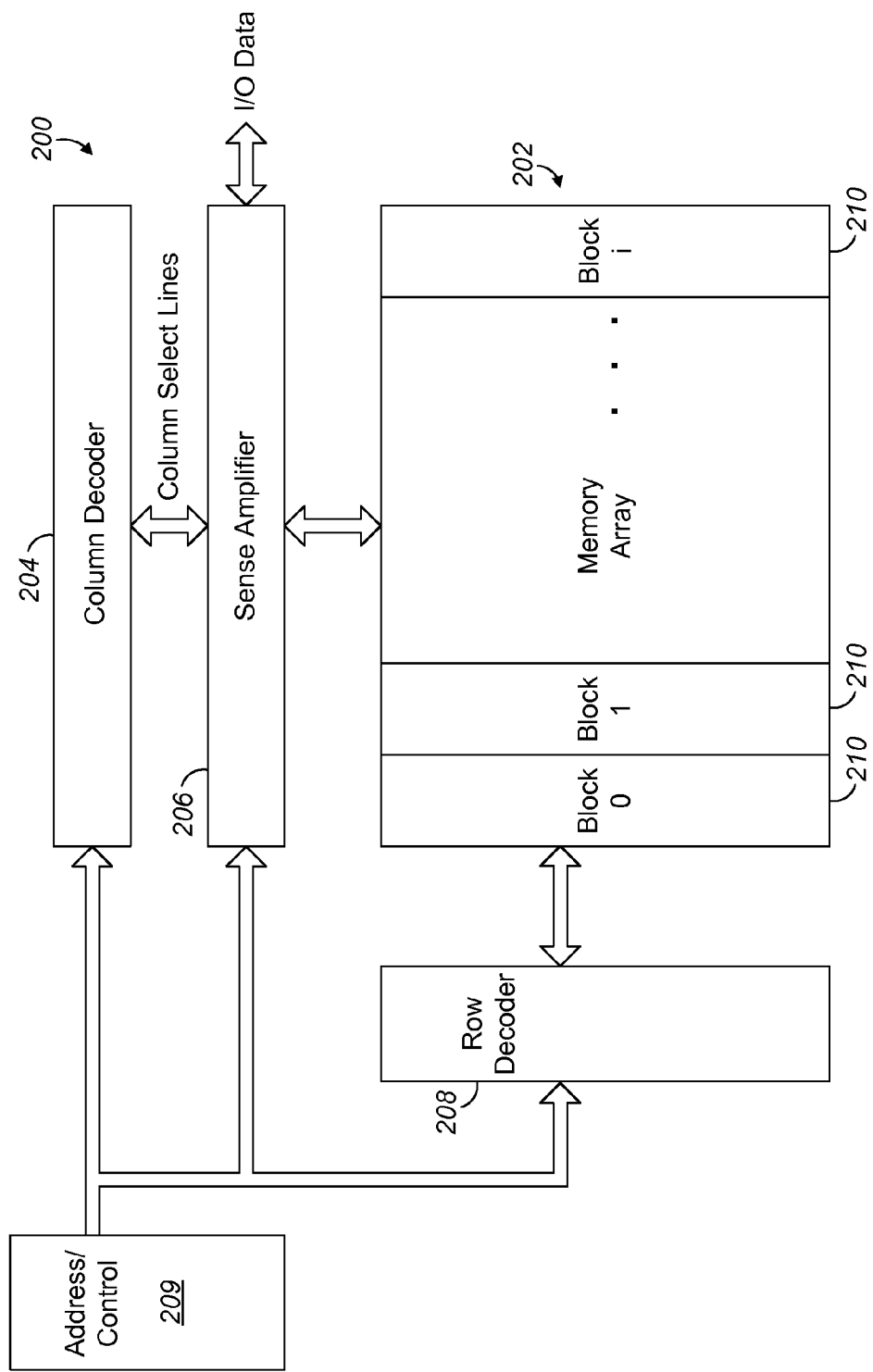
FIG. 2 shows a block diagram of a memory device in accordance with the present disclosure.

FIG. 2 shows a block diagram of a memory device 200 in accordance with an embodiment of the present disclosure. The memory device 200 can include a memory array 202, a column decoder 204, a sense amplifier 206, and a row decoder 208, and a memory controller 209. The memory array 202 can include a plurality of memory blocks 210.

The memory device 200 can be configured such that the memory array 202 includes NOR flash memory cells 214 arranged in memory blocks 210, which are designated as Block 0 through Block i, where "i" can be any desired natural number according to design specifications of the particular implementation. Address and control signals can be input on address/control lines from the memory controller 209 to the memory array 202 via the column decoder 204, sense amplifier 206, and row decoder 208 for performing read and write operations, among other things, to the memory array 202. The memory controller 209 can include address and control circuitry, and can be configured to communicate with other devices, for example one or more processors, external to the memory device 200. The memory controller 209 is also configured to issue a suspend command for interrupting an erase operation in the memory array 202 in order to allow for another operation, such as a read or program operation, in the memory array 202.

Figure 3:
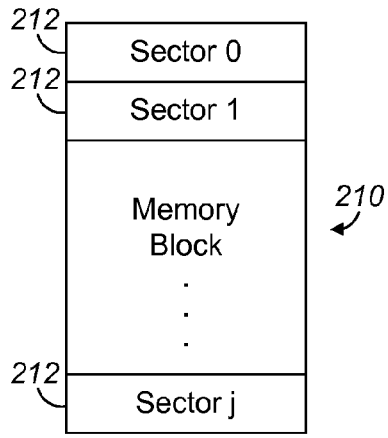
FIG. 3 shows a block diagram of a memory block of the memory device shown in FIG. 2.

As shown in FIG. 3, each memory block 210 includes NOR flash memory cells 214 arranged in memory sectors 212, which are designated as Sector 0 through Sector j, where "j" can be any desired natural number according to design specifications of the particular implementation. For example, the memory blocks 210 or shared substrate memory cells can form 64 kB or 128 kB of memory, which is organized into memory sectors 212 of 4 kB of memory each.

Figure 4:
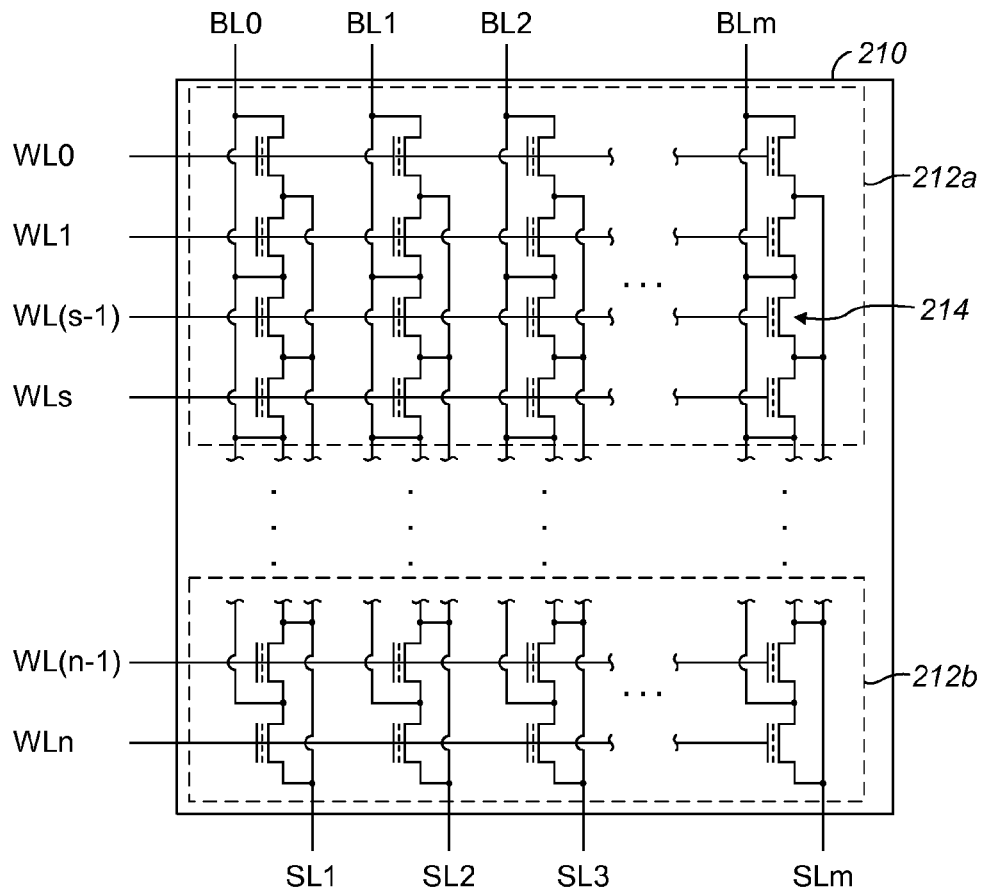
FIG. 4 shows a schematic block diagram of a memory block of the memory device shown in FIG. 2.

FIG. 4 shows a more detailed schematic diagram of the memory block 210 in accordance with an embodiment of the present disclosure. The memory block 210 includes a plurality of memory sectors 212, including the illustrated memory sectors 212a and 212b. The memory sectors 212a and 212b include respective groups of flash memory cells 214 arranged in a NOR flash architecture. The memory block 210 also includes a plurality of bit lines BL0-BLm, a plurality of word lines WL0-WLn, and a plurality of source lines SL0-SLm, which allow for communication between the memory cells 214 and components of the memory device 200 that are outside of the memory block 210, such as column and row decoders 204 and 208, sense amplifier 206, and memory controller 209.

In the illustrated embodiment, the first memory sector 212a includes word lines WL0-WLs, where "s" can be any desired natural number according to design specifications of the particular implementation.

The memory block 210 can form a portion of a flash memory device 200 that supports a suspend-resume function. For example, the memory controller 209 of the flash memory device 200 can be configured to issue a suspend command during an erase operation in order to allow the erase operation to be interrupted for another operation. For example, the erase procedure can be interrupted so that data can be read from, or programmed to, memory cells 214 of other sectors 212 or blocks 210 of the flash memory device 200.

Figure 5:
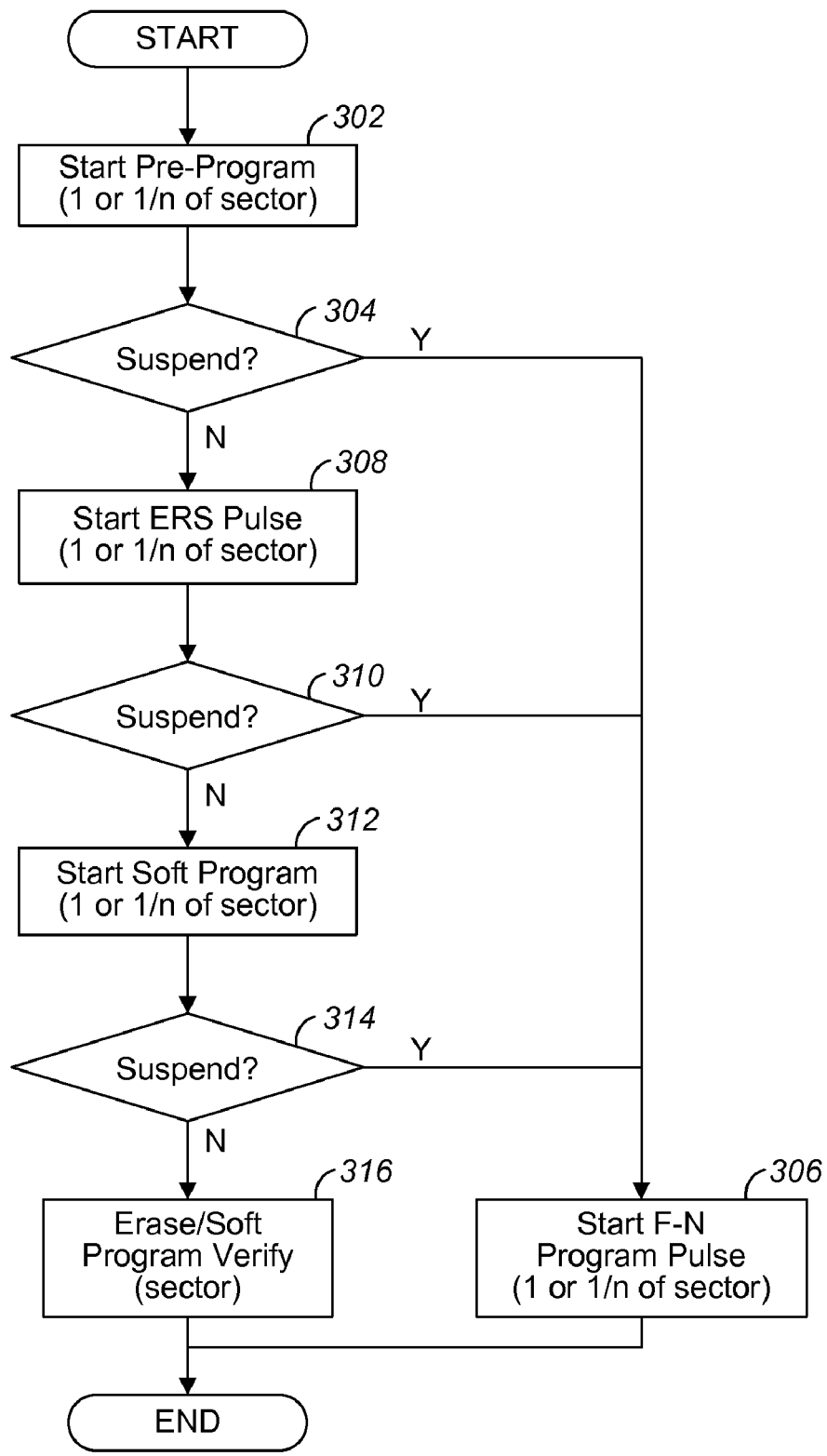
FIG. 5 shows a flowchart of an erase operation in accordance with the present disclosure.

FIG. 5 shows a flowchart of a sector erase operation used in the flash memory device 200. In the memory device 200, memory cells 214 are erased in groups by sector such that memory cells 214 of a given sector 212 are erased together as a group. For example, in order to erase one of the memory cells 214 of the memory sector 212a, the operation according to FIG. 5 will erase all of the memory cells 214 of the memory sector 212a, while memory cells of other memory sectors, such as memory sector 212b, remain unaffected. Since only memory cells 214 of a memory sector 212 are erased, the less time is required for the erase procedure than would otherwise be required for erasing memory cells 214 of an entire memory block 210.

The sector erase operation includes a pre-program process at block 302, an erase (ERS pulse) process at block 308, a soft program process at block 312, and an erase/soft program verify process at block 316. The sector erase operation shown in FIG. 5 is described in connection with the memory sector 212a shown in FIG. 4. However, the sector erase operation shown in FIG. 5 can be similarly performed for erasing other memory sectors 212 of the memory array 202.

During the pre-program process at block 302, the floating gates of all of the memory cells 214 in the memory sector 212a are programmed to have approximately the same amount of electrons so that all of the memory cells 214 in memory sector 212a have approximately the same threshold voltage. During the pre-program process 302, a pre-program pulse is applied to all of the memory cells 214 in the memory sector 212a. In some embodiments, the pre-program process 302 can include a pre-program verify process wherein all of the memory cells 214 in the memory sector 212a are checked to verify that their respective threshold voltages are approximately the same after application of the pre-program pulse. In such embodiments, if an insufficient number of memory cells 214 have the desired threshold voltage, then application of the pre-program pulse to the memory cells 214 can be repeated.

During the erase process at block 308, all of the memory cells 214 in the memory sector 212a are erased by applying an erase (ERS) pulse to the memory cells 214 in the memory sector 212a in order to remove electrons from the floating gates of all the memory cells in the memory sector 212a. During the erase process at block 308, an ERS pulse can be applied to all of the memory cells 214 in the memory sector 212a such that there is a voltage at the source, drain, and/or substrate of each memory cell transistor that is more positive than the voltage at the gate of each memory cell transistor, thereby forcing electrons to migrate out of the floating gates of the transistors.

In some embodiments, the erase process at block 308 can include an erase verify process, during which all of the memory cells 214 in the memory sector 212a can be checked to verify whether they have been erased. In such embodiments, if the number of erased memory cells is sufficient, then the memory sector 212a is regarded as being erased successfully. In such embodiments, if the memory sector 212a fails to pass the erase verify process, all of the memory cells 214 in the memory sector 212a can be erased again by applying another ERS pulse. In some such embodiments, a voltage-stepping procedure can be employed wherein the voltage is increased for each iteration of the erase/erase verify process at block 308. In other such embodiments, a time-stepping procedure can be employed wherein the pulse width of the erase pulse can be increased for each iteration of the erase/erase verify process at block 308.

In actual implementations, the threshold voltages of memory cells 214 can vary within the memory sector 212a, such that the voltage of the ERS pulse required for erasing memory cells 214 can vary from one memory cell 214 to another, for example due to variations among floating-gate transistors during manufacturing. During the erase process at block 308, the application of the ERS pulse can result in over-erasure of some memory cells 214. An over-erased memory cell can cause other memory cells coupled to the same column as the over-erased memory cell to be regarded as erased cells, even though they may be programmed. Therefore, over-erased cells can be repaired using the soft program cycle that includes blocks 312 and 316.

During the soft program process at block 312, over-erased memory cells in the memory sector 212a are detected and repaired. During the soft program process at block 312, all of the memory cells 214 in the memory sector 212a are checked to determine whether any of the memory cells 214 are over-erased. If an over-erased memory cell is detected, it is repaired by applying a soft-program pulse to the floating-gate transistor of the over-erased memory cell.

The soft-program pulse is different from a normal programming pulse in that the wordline and bitline voltages for the soft-program pulse are lower than the wordline and bitline voltages for the normal programming pulse. Also, unlike a programming pulse that is performed for programming a memory cell, a soft-program pulse is performed for erasing an over-erased memory cell. For example, in some embodiments, an erased memory cell can be representative of logic state "1" and a programmed memory call can be representative of logic state "0". In such embodiments, the soft-program pulse would result in writing a logic state "1," while the programming pulse would result in writing a logic state "0."

During the soft program verify process at block 316, all of the memory cells 214 in the memory sector 212a are checked to determine whether any over-erased memory cells remain after the application of the soft-program pulse. If the number of over-erased memory cells in the memory sector 212a is less than or equal to a predetermined number, e.g., zero, the memory sector 212a is regarded as passing the soft program verify process at block 312. If the memory sector 212a fails to pass soft program verify process at block 312, the soft program process at block 312 can be performed again. The soft program cycle including the soft program process at block 312 and the soft program verify process at block 316 can be performed successively until the memory sector 212a passes the soft program verify process at block 316.

Since the memory device 200 supports a suspend command in order to perform an interrupting procedure, for example a read or program procedure, the erase procedure can be interrupted by a suspend command before the erase procedure is completed, as represented by blocks 304, 310, and 314. For performance reasons, only a very limited amount of time is desirable between the time the suspend command is issued by the memory controller 209 and the time that control is handed over to the interrupting command, such as a read or program command. For example, in some embodiments, once a suspend command is issued, the control should switch to the interrupting command in 20 µs.

Depending on where the suspend command interrupts the erase procedure, problems can occur if control is handed over without further action. In the flash memory array 202, each block 210 includes multiple memory sectors 212 that share a common substrate. For example, in the memory block 210, memory cells 214 of the memory sector 212a share bit lines BL0-BLn and source lines SL0-SLn with memory cells 214 of the memory sector 212b. Thus, if the erase procedure is interrupted, for example during the erase process at block 308 or during the soft programming process at block 312, the memory cells 214 of memory sector 212a can potentially create leakage that can affect the shared bit line memory cells 214 of other memory sectors 212 during a subsequent read or program command of the other memory sectors 212.

In the process shown in FIG. 5, if a suspend command is received at any point during the process, then the erase operation is shifted to block 306, where a Fowler-Nordheim (FN) program pulse process is carried out. In some embodiments, the FN programming at block 306 can be applied to all memory cells 214 of the memory sector 212a. In alternative embodiments, the FN programming at block 306 can be applied only to memory cells 214 of the memory sector 212a for which the erase process of blocks 302, 308, 312, and 316 was not completed. During the FN program procedure at block 306, a positive voltage is applied to word lines WL0-WLs of the memory sector 212a undergoing the erase procedure, and a negative voltage is applied to the substrate of the sector 212a for each memory cell 214 undergoing the FN programming.

Figure 6:
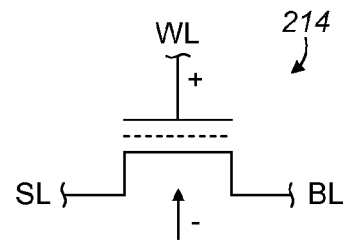
FIG. 6 shows a schematic diagram of a memory cell of the memory device shown in FIG. 2.

FIG. 6 shows a memory cell 214 undergoing the FN programming, where a positive voltage is applied to the gate of the transistor and a negative voltage is applied to the substrate over which the transistor is formed. The FN programming results in programmed memory cells rather than erased memory cells because the FN programming drives electrons into the floating gates of the respective memory cell transistors rather than out of them as occurs during the erasing process. However, the programmed memory cells resulting from block 306 will not cause leakage during the interrupting procedure as could otherwise occur with over-erased memory cells. Since the area of the memory sector 212a is relatively small, the FN program operation can be performed without affecting memory cells 214 in other memory sectors, such as sector 212b. The FN program operation at block 306 can advantageously be completed in a short enough amount of time to meet the timing requirements of the suspend command so that leakage can be avoided.

In some embodiments, once the interrupting procedure is completed, the erase process in FIG. 5 can be repeated or resumed for erasing at least those memory cells that were programmed at block 306.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. An erase method for use in a memory array including a plurality of memory cells, the memory array being divided into a plurality of memory sectors, the memory sectors each comprising a portion of the plurality of memory cells, the method comprising:
    performing an erase process for erasing memory cells of a first memory sector of the plurality of memory sectors; and
    in response to a suspend command, interrupting the erase process and performing a programming operation on at least one memory cell of the first memory sector of the plurality of memory sectors.

2. The method of claim 1, wherein the first memory sector is a portion of one of the plurality of sectors.

3. The method of claim 1, wherein the programming operation includes a Fowler-Nordheim programming operation.

4. The method of claim 3, wherein the at least one memory cell includes a transistor formed on a substrate, and wherein the programming operation includes applying a positive voltage to a gate of the transistor and applying a negative voltage to the substrate.

5. The method of claim 1, wherein the erase process includes applying a pre-program pulse to memory cells of the first memory sector.

6. The method of claim 1, wherein the erase process includes applying an erase pulse to memory cells of the first memory sector.

7. The method of claim 1, wherein the erase process includes applying a soft-program pulse to memory cells of the first memory sector.

8. A memory device comprising:
    a memory array comprising a plurality of memory cells, the memory array being divided into a plurality of memory blocks, each memory block being divided into a plurality of memory sectors, the memory sectors each comprising a portion of the plurality of memory cells; and
    a memory controller configured for:
        performing an erase process for erasing memory cells of a first memory sector of the plurality of memory sectors;
        suspending the erasing the memory cells of the first memory sector while performing the erase process in order to perform an interrupting operation; and
        performing a programming operation on at least one memory cell of the first memory sector after suspending the erasing of memory cells but before performing the interrupting operation.

9. The memory device of claim 8, wherein the programming operation includes a Fowler-Nordheim program operation.

10. The memory device of claim 9, wherein the at least one memory cell includes a transistor formed on a substrate, and wherein the programming operation includes applying a positive voltage to a gate of the transistor and applying a negative voltage to the substrate.

11. The memory device of claim 8, wherein the erase process includes applying a pre-program pulse to memory cells of the first memory sector.

12. The memory device of claim 8, wherein the erase process includes applying an erase pulse to memory cells of the first memory sector.

13. The memory device of claim 8, wherein the erase process includes applying a soft-program pulse to memory cells of the first memory sector.

* * * * *